United States Patent
Smith et al.

(10) Patent No.: US 11,398,395 B2
(45) Date of Patent: Jul. 26, 2022

(54) SUBSTRATE CONTAINER WITH LATCHING MECHANISM HAVING TWO CAM PROFILES

(71) Applicant: ENTEGRIS, Inc., Billerica, MA (US)

(72) Inventors: Mark Vincent Smith, Colorado Springs, CO (US); Christopher Strickhouser, Monument, CO (US)

(73) Assignee: ENTEGRIS, INC., Billerica, MA (US)

(*) Notice: Subject to any disclaimer, the term of this patent is extended or adjusted under 35 U.S.C. 154(b) by 388 days.

(21) Appl. No.: 16/339,589

(22) PCT Filed: Dec. 13, 2017

(86) PCT No.: PCT/US2017/066144
§ 371 (c)(1),
(2) Date: Apr. 4, 2019

(87) PCT Pub. No.: WO2018/112055
PCT Pub. Date: Jun. 21, 2018

(65) Prior Publication Data
US 2019/0295875 A1    Sep. 26, 2019

Related U.S. Application Data

(60) Provisional application No. 62/435,396, filed on Dec. 16, 2016.

(51) Int. Cl.
*E05C 9/06* (2006.01)
*E05C 9/10* (2006.01)
*H01L 21/673* (2006.01)

(52) U.S. Cl.
CPC .......... *H01L 21/67373* (2013.01); *E05C 9/06* (2013.01); *E05C 9/10* (2013.01);
(Continued)

(58) Field of Classification Search
CPC . B65D 45/16; H01L 21/3732; H01L 21/6735; H01L 21/67373; H01L 21/67376;
(Continued)

(56) References Cited

U.S. PATENT DOCUMENTS 554,126 A * 2/1896 Hulse et al. ........ E05B 65/0075
70/119
2,481,429 A * 9/1949 Kerr ........................ B60J 9/02
292/21
(Continued)

FOREIGN PATENT DOCUMENTS

JP    2000039006 A    2/2000
KR   20160002883 A    1/2016
(Continued)

*Primary Examiner* — Christine M Mills
*Assistant Examiner* — Faria F Ahmad
(74) *Attorney, Agent, or Firm* — Entegris, Inc.

(57) ABSTRACT

A door of a substrate container includes a latching mechanism for operating at least two latch members. The substrate container can be a front opening substrate container or a bottom opening substrate container. The latching mechanism can include a rotatable cam having a first rotational profile out of phase with a second rotational profile such that when the cam is rotated to operate the latch mechanism from the disengaged position to the engaged position, a first latch member engages a first corresponding slot in a door frame prior to a second latch member engaging a second corresponding opening provided in the door frame such that the latch members are operated in a staggered manner. This staggered latching configuration allows for the application of a load provided by the system to be used in the most efficient manner per latch arm or per set of latch arms.

20 Claims, 15 Drawing Sheets

(52) U.S. Cl.
CPC ..... *H01L 21/67376* (2013.01); *Y10T 292/084* (2015.04); *Y10T 292/0806* (2015.04); *Y10T 292/0834* (2015.04); *Y10T 292/0837* (2015.04); *Y10T 292/0839* (2015.04); *Y10T 292/0964* (2015.04); *Y10T 292/1015* (2015.04)

(58) Field of Classification Search
CPC ......... Y10T 292/0837; Y10T 292/0839; Y10T 292/1015; Y10T 292/084; Y10T 292/0834; Y10T 292/0806; Y10T 292/0964; E05B 65/0075; E05C 9/06; E05C 9/10
See application file for complete search history.

(56) References Cited

U.S. PATENT DOCUMENTS

| | | | | |
|---|---|---|---|---|
| 3,884,515 | A * | 5/1975 | Ashkenazi | E05C 9/14 292/34 |
| 5,911,763 | A | 6/1999 | Quesada | |
| 5,915,562 | A * | 6/1999 | Nyseth | H01L 21/67373 206/710 |
| 5,957,292 | A | 9/1999 | Mikkelsen et al. | |
| 6,105,782 | A * | 8/2000 | Fujimori | H01L 21/67376 206/710 |
| 6,398,033 | B1 | 6/2002 | Wu et al. | |
| 6,622,883 | B1 * | 9/2003 | Wu | H01L 21/67373 206/710 |
| 6,902,063 | B2 | 6/2005 | Pai et al. | |
| 7,549,552 | B2 * | 6/2009 | Hasegawa | H01L 21/67373 220/323 |
| 7,726,490 | B2 * | 6/2010 | Matsutori | H01L 21/67373 206/711 |
| 7,909,166 | B2 * | 3/2011 | Lin | H01L 21/67373 206/710 |
| 7,971,723 | B1 * | 7/2011 | Chiu | H01L 21/67373 206/711 |
| 8,083,272 | B1 * | 12/2011 | Wu | H01L 21/67373 292/156 |
| 8,091,710 | B2 * | 1/2012 | Hasegawa | H01L 21/67373 206/711 |
| 8,196,748 | B2 * | 6/2012 | Chiu | H01L 21/67373 206/711 |
| 8,276,527 | B2 * | 10/2012 | Stepp | E05B 65/0075 109/64 |
| 8,276,758 | B2 * | 10/2012 | Lin | H01L 21/67373 206/710 |
| 8,347,665 | B2 * | 1/2013 | Rasmussen | E05B 47/0673 70/91 |
| 8,469,408 | B2 * | 6/2013 | Li | E05C 9/14 292/37 |
| 8,540,289 | B2 * | 9/2013 | Nakatogawa | H01L 21/67373 292/37 |
| 9,514,971 | B2 * | 12/2016 | Phark | H01L 21/67373 |
| 10,173,812 | B2 * | 1/2019 | Gregerson | H01L 21/67386 |
| 10,723,525 | B2 * | 7/2020 | Gregerson | H01L 21/67376 |
| 2010/0031857 | A1 * | 2/2010 | Dunstan | E05C 19/006 109/74 |
| 2010/0032339 | A1 | 2/2010 | Hasegawa et al. | |
| 2010/0327716 | A1 | 12/2010 | Li | |
| 2011/0193352 | A1 * | 8/2011 | Huang | E05C 9/025 292/139 |
| 2014/0299597 | A1 * | 10/2014 | He | B65D 45/16 220/203.2 |
| 2014/0319020 | A1 * | 10/2014 | Gregerson | H01L 21/67769 206/710 |
| 2016/0060918 | A1 * | 3/2016 | Garrett | E05C 9/16 109/64 |
| 2016/0163575 | A1 | 6/2016 | Phark et al. | |
| 2019/0106249 | A1 * | 4/2019 | Gregerson | H01L 21/67386 |
| 2020/0040623 | A1 * | 2/2020 | Rasmussen | E05C 9/006 |

FOREIGN PATENT DOCUMENTS

| | | |
|---|---|---|
| TW | 433258 U | 5/2001 |
| TW | 437723 | 5/2001 |
| TW | 534165 U | 5/2003 |
| TW | 201200699 A | 1/2012 |

\* cited by examiner

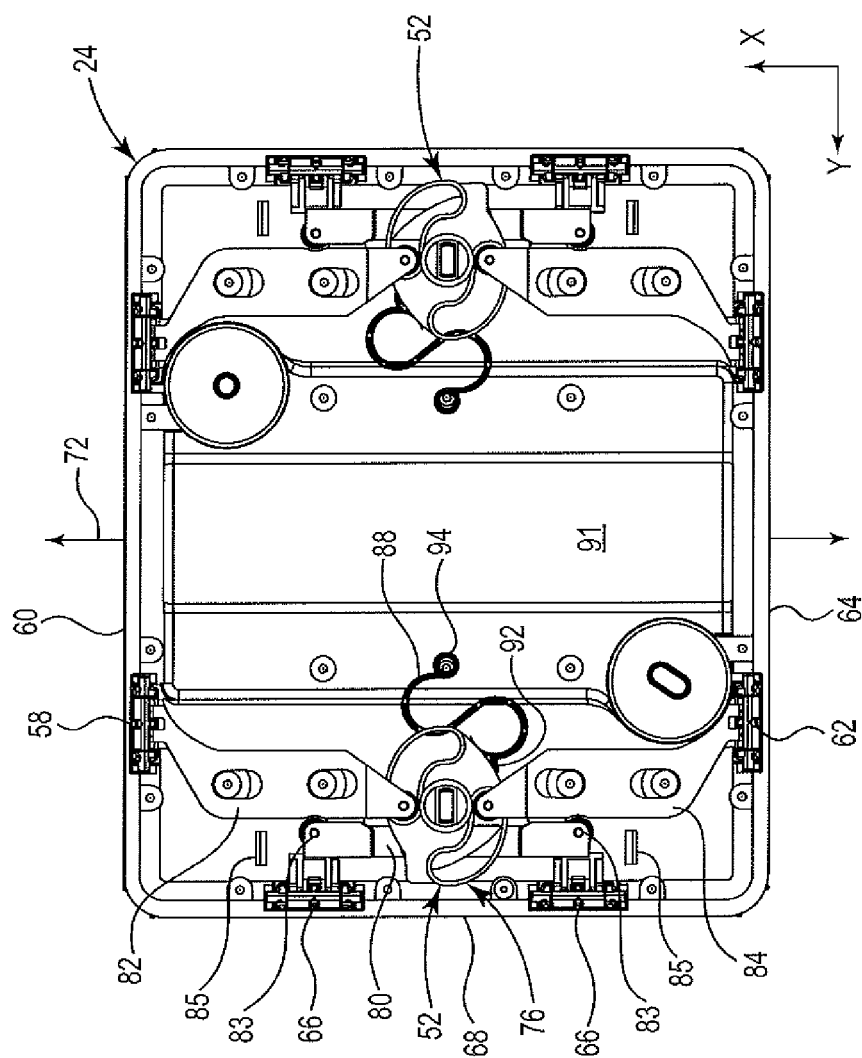

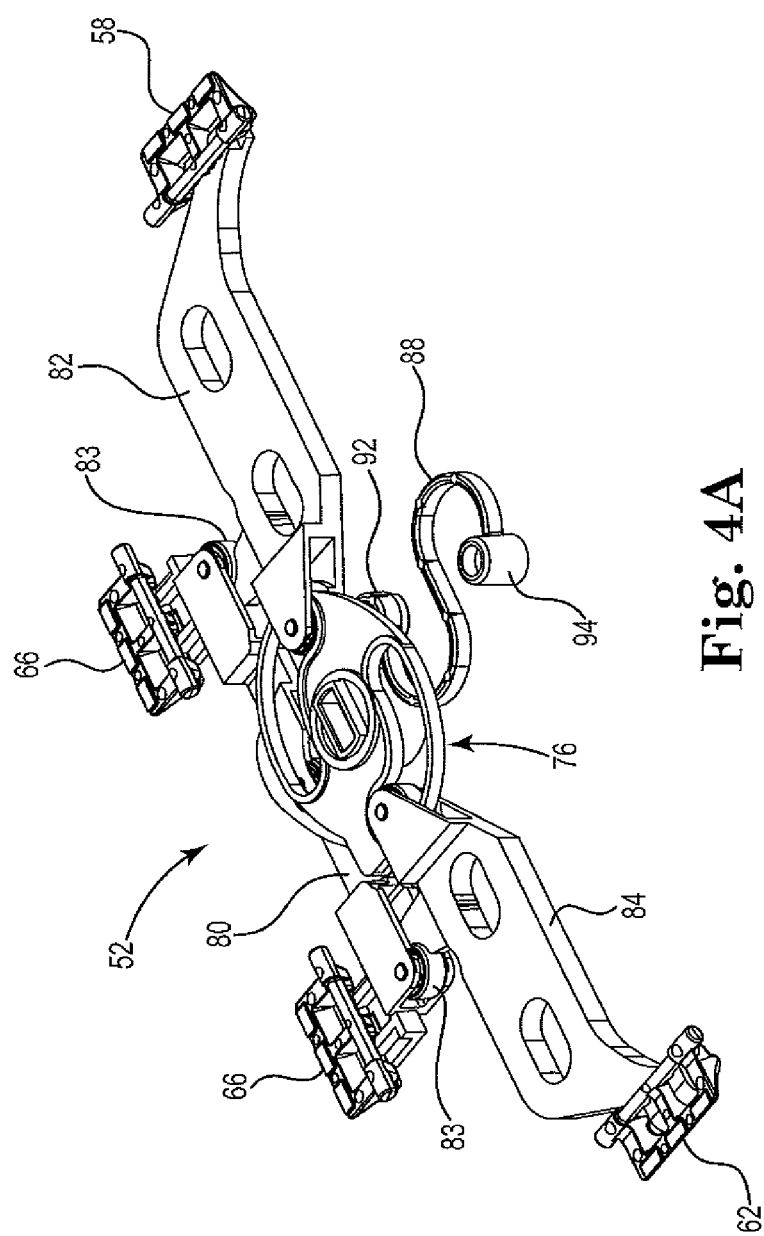

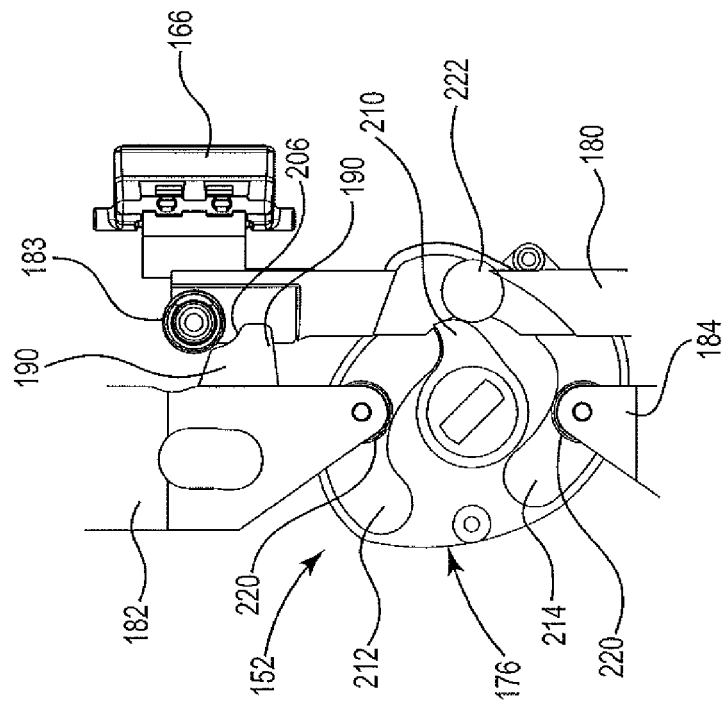
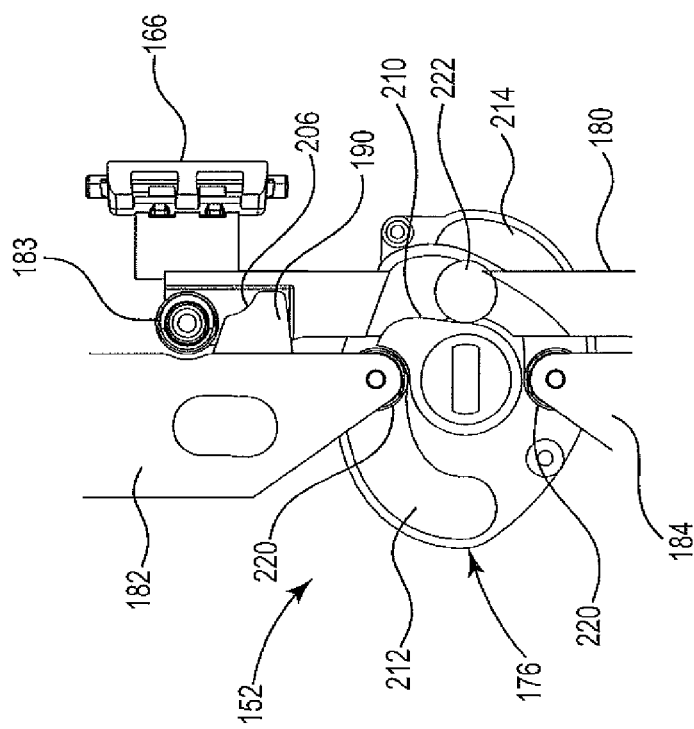

SUBSTRATE CONTAINER WITH LATCHING MECHANISM HAVING TWO CAM PROFILES

CROSS REFERENCE TO RELATED APPLICATIONS

This application claims the benefit of and priority to U.S. Provisional Application No. 62/435,396, filed on Dec. 16, 2016, the entirety of which is incorporated herein by reference in its entirety for all purposes.

TECHNICAL FIELD

The disclosure relates generally to substrate containers and more particularly to a latching mechanism used to latch and unlatch the door of such containers.

BACKGROUND

Semiconductor substrates such as, for example, silicon wafers, are subjected to numerous steps during processing. This usually entails transporting a plurality of wafers between workstations or facilities for processing. Semiconductor wafers are delicate and easily damaged by physical contact or shock and by static electricity. Further, semiconductor manufacturing processes are extremely sensitive to contamination by particulates or chemical substances. As a way to reduce the potentially negative effect of contaminants on the substrates, specialized substrate containers have been developed to minimize the generation of contaminants and to isolate the substrates from contaminants exterior to the containers. These containers typically include a removable door having a gasket, seal or other means for isolating the substrates within the container body from the environment external to the container. Exemplary containers include front opening unified pods (FOUPs), front opening shipping boxes (FOSBs), multi-application carriers (MACs) and standard mechanical interface pods (SMIF pods).

As semiconductors have become smaller in Scale, that is, as the number of circuits per unit area has increased, contaminants in the form of particulates consequently have become more problematic. The size of particulates that can potentially damage an integrated circuit has decreased, and is approaching the molecular level. Thus, better particulate control is desirable during all phases of manufacturing, processing, transporting, and storage of semiconductor wafers. Additionally, as circuit geometries become smaller, processing wafers in a low oxygen environment and/or a low moisture environment can be beneficial. Means for maximizing and maintaining the efficacy of the door seal, particularly in larger diameter substrate carriers, are needed.

SUMMARY

The disclosure relates generally to substrate containers and more particularly to latching mechanism used to latch and unlatch the door of such containers.

In one illustrative embodiment, a substrate container includes a container body defining a door frame having a plurality of openings. A door is received in the door frame, and includes a latching mechanism disposed within the door. The latching is mechanism operable between a disengaged position and an engaged position. The latching mechanism includes: a rotatable cam having a first rotational profile out of phase with a second rotational profile; a first latch arm coupled to the rotatable cam, the first latch arm having first and second distal ends and including a first latch member configured to be received in a first corresponding opening in the door frame when the latching mechanism is in the engaged position; and a second latch arm coupled to the rotatable cam and including a second latch member configured to be received in a second corresponding opening in the door frame when the latching mechanism is in the engaged position. When the cam is rotated to operate the latch mechanism from the disengaged position to the engaged position, the first latch member engages the first corresponding opening in the door frame at a point in time before the second latch member engages the second corresponding opening provided in the door frame. The substrate container can be a front opening substrate container or a bottom opening substrate container.

In another illustrative embodiment, a door for use with a substrate container includes: a latch mechanism including a rotatable cam having a first rotational profile out of phase with a second rotational profile; a first latch arm coupled to the rotatable cam, the first latch arm having first and second distal ends and including a first latch member configured to move from a disengaged position to an engaged position; and a second latch arm coupled to the rotatable cam and including a second latch member configured to move from a disengaged position to an engaged position. When the cam is rotated to operate the latch mechanism from the disengaged position to the engaged position, the first latch arm moves in a direction that is approximately orthogonal to a direction of movement of the second latch arm, and the first latch member transitions to the engaged position at a point in time before the second latch member transitions to the engaged position.

In some embodiments, a door of a substrate container can include two latch mechanisms located an equal distance from a center line of the door. Each latch mechanism includes a horizontal side arm having two latch members and upper and lower vertical arms having one latch member each such that the door of the substrate container includes eight latches distributed about the perimeter of the door, wherein two latch members are located on the right side of the door, two latch members are located on the left side of the door, two latch members are located on the top of the door and two latch members are located on the bottom of the door. The latch mechanism includes a cam having two independent rotational profiles that are out of phase with one another such that when the cam is rotated to operate the latch mechanisms, the latch members located on the sides are the door are transitioned from a disengaged position to an engaged position at a point in time before the latch members located at the top and bottom of the door are transitioned from a disengaged position to an engaged position. When the door is mounted within the opening of a container body as defined by a door frame, each of the latch members are engaged within a corresponding slot provided in the door frame when in the engaged position.

The preceding summary is provided to facilitate an understanding of some of the innovative features unique to the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments in connection with the accompanying drawings, in which:

FIGS. 3A and 3B are top plan views of a door of a substrate container showing the latching mechanisms in accordance with an embodiment of the disclosure.

FIG. 4A is a top perspective view of a door latch mechanism in accordance with an embodiment of the disclosure.

FIGS. 10A-10C are close-up schematic views of a portion of a door latch mechanism according to an embodiment of the disclosure in various stages of operation between an unlatched and latched position While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

As used in this specification and the appended claims, the singular forms "a", "an", and "the" include plural referents unless the content clearly dictates otherwise. As used in this specification and the appended claims, the term "or" is generally employed in its sense including "and/or" unless the content clearly dictates otherwise.

The following detailed description should be read with reference to the drawings in which similar elements in different drawings are numbered the same. The detailed description and the drawings, which are not necessarily to scale, depict illustrative embodiments and are not intended to limit the scope of the disclosure. The illustrative embodiments depicted are intended only as exemplary. Selected features of any illustrative embodiment may be incorporated into an additional embodiment unless clearly stated to the contrary.

Figure 1:
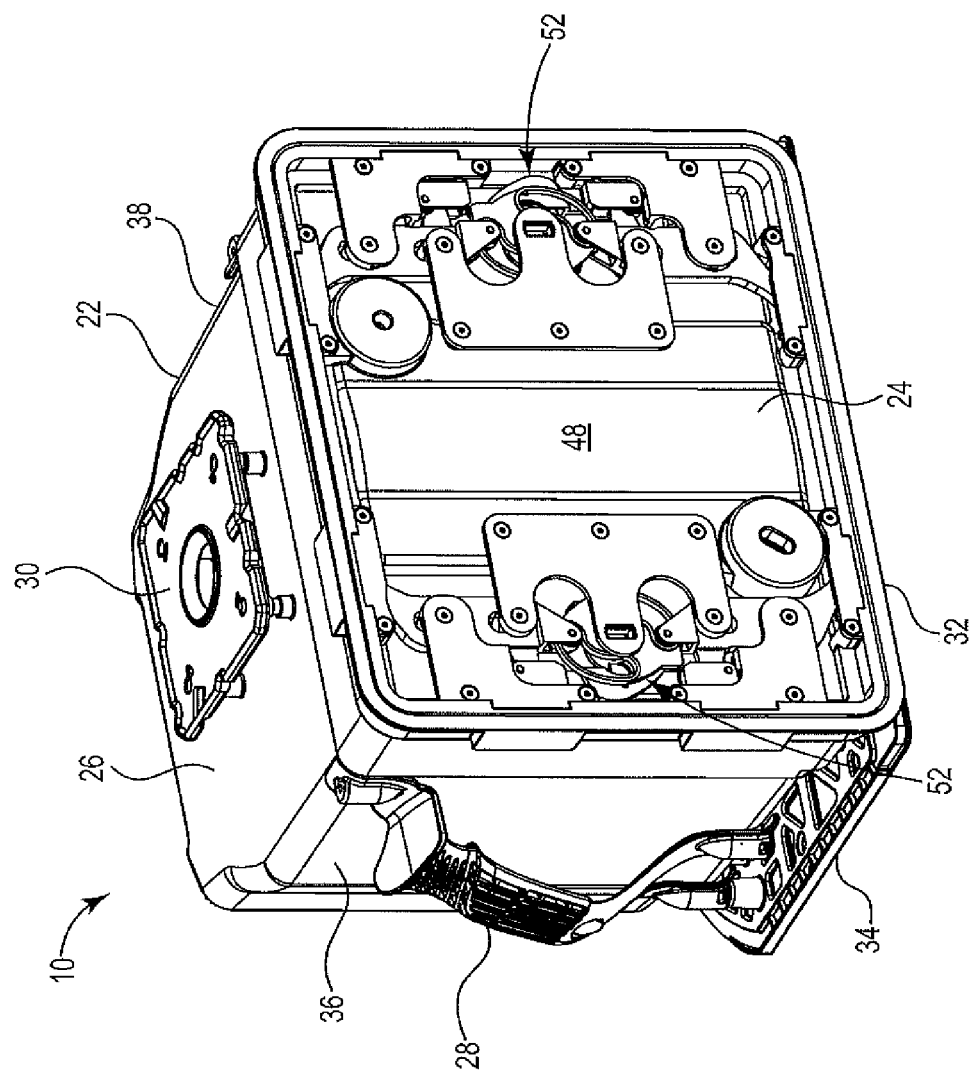
FIG. 1 is a perspective view of a substrate container.
Figure 2:
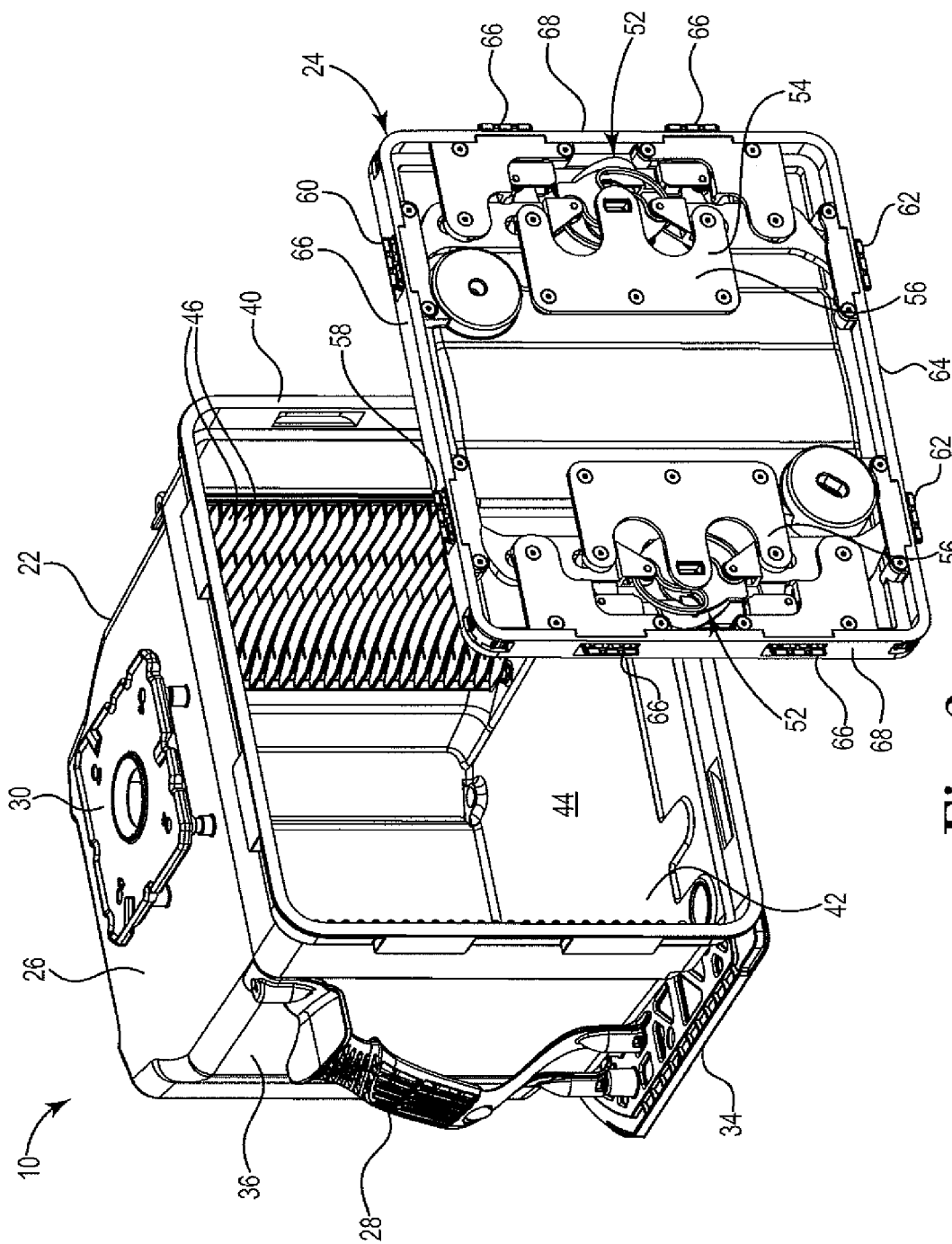
FIG. 2 is a perspective view of the substrate container of FIG. 1 with the door removed.

FIGS. 1-2 show an exemplary substrate container 20 configured to hold a plurality of substrates. Exemplary substrates can include, but are not limited to: raw silicon wafers, semi-processed silicon wafers, bonded wafers, flat panels, glass panels, printed circuit boards, and/or the like. In one example, the substrate container 20 is configured to contain a plurality of wafers used in the semiconductor manufacturing industry. The substrate container 20 may be any front opening substrate carrier such as, for example, a front opening unified pod (FOUP), a front opening shipping box (FOSB), or a multi-application carrier (MAC). In some cases, the substrate container can be a bottom opening container such as a standard mechanical interface pod or SMIF pod or a reticle SMIF pod. For the purpose of simplicity, the embodiments described herein are described in the context of a FOUP, as shown in FIGS. 1-2. However, it will be generally understood by those of skill in the art that many of the concepts disclosed herein may have applicability to other substrate containers or other carriers including those having different sizes, shapes and dimensions other than those containers as discussed herein. For example, a container may have a generally cylindrical body and a generally round opening. Additionally, the substrate container is not limited to a particular size of substrate. Rather, the embodiments described herein are applicable to different to substrate carriers of different sizes. For example, the embodiments described herein are applicable to carriers configured to accommodate 300 mm diameter wafers or 450 mm diameter wafer, but not limited to these.

The substrate container 20 may be made from a variety of thermoplastic polymeric materials and more particularly, a thermoplastic polymer that is designed to minimize particle shedding. In some cases, the substrate container 20 may include a barrier material that provides low water vapor transmission rates and/or or electrostatic dissipative material. A portion, if not all, of the substrate container 20 can be injection molded.

As shown in FIGS. 1 and 2, the substrate container 20 includes a container body 22 and a door 24. The container body 22 includes a top 26 with a robotic flange 30, a bottom 32 having kinematic coupling plate 34, a left side 36, a right side 38, and a door frame 40 defining a door opening 42 leading to an open interior 44 with wafer shelves 46 for supporting a number of substrates. In some cases, as shown, a pair of side handles 28 can be provided on the left and right sides 36, 38 of the container body 22 so that the container 20 may be picked up and manually moved by a person, but this is not required.

The door 24 includes a cover (not shown) secured to a base 48. The door cover and base 48 cooperate to define an enclosure that contains the door latch mechanisms 52 as will be described in greater detail herein. In some cases, the latch mechanisms 52 can include a latch mechanism cover 54. The latch mechanism cover 54 can include a panel that covers the latch mechanism 52.

When the door 24 is received within the door frame 40, a seal is formed between the door 24 and the door frame 40, which helps to isolate the substrates contained within the wafer container 20 from the environment external to the wafer container. In many cases, a gasket (not shown) is provided around perimeter of the door to aid in formation of the seal between the door 24 and the door frame 40. In addition, one or more latch mechanisms such as, for example, latch mechanisms 52, used to secure the door 24 in the frame 40 can affect the quality of the seal formed between the door 24 and the door frame 40.

Leakage, sometimes referred to as conductance, of moisture and/or oxygen into the microenvironment of the wafer container 10 is a known problem. With increasing requirements for improved control over the amount of oxygen and/or relative humidity in the microenvironment of the sealed container 10, there is an increased need for achieving and maintaining the efficacy and/or robustness of the seal between the door 24 and door frame 40 when the door 24 is received in the door frame 40 of the container body 22, the container 10 is closed, and latch mechanisms 52 are engaged.

The latching configurations, described herein according to the various embodiments, utilize a plurality of latches or latch members distributed around the perimeter of the container body 22. At least four latch members can be distributed around the perimeter of the container body 22. In some examples, a latching configuration can include six, eight or ten latch members distributed around in the perimeter of the container body 20. With latching configurations utilizing six, eight, or even ten latch members distributed around the perimeter of the container body 22, the latching action is more symmetrical about the perimeter of the door 24. In addition, the loading on the frame 40 applied by the latch mechanisms 52 which are used to operate the latch members is more evenly distributed around the perimeter of door frame 40, reducing the tendency of the door 24 to deflect or warp, particularly when the container 10 is transported by an overhead transportation system (OHT) within a semiconductor processing facility. Minimizing the deflection of the door 24 can improve the quality of the seal created between the door 24 and the door frame 40 which may lower oxygen and/or moisture conductance. In one exemplary embodiment, as can be seen in FIGS. 2-3B, the latching configuration includes eight latch members: two latch members 58 located along a top 60 of the door 24; two latch members located 62 along a bottom 64 of the door 24; and two latch members 66 located on each of the sides 68 (left and right) of the doors 24.

Figure 3B:
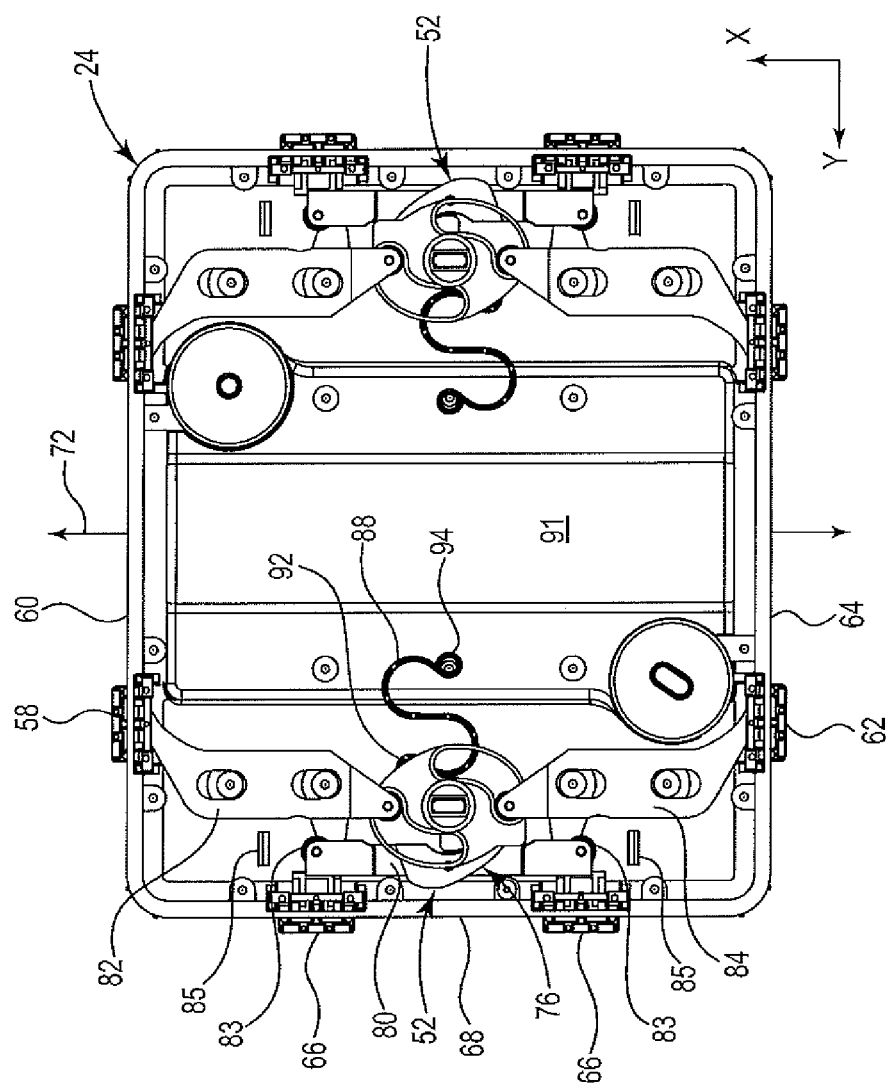
Figure 4B:
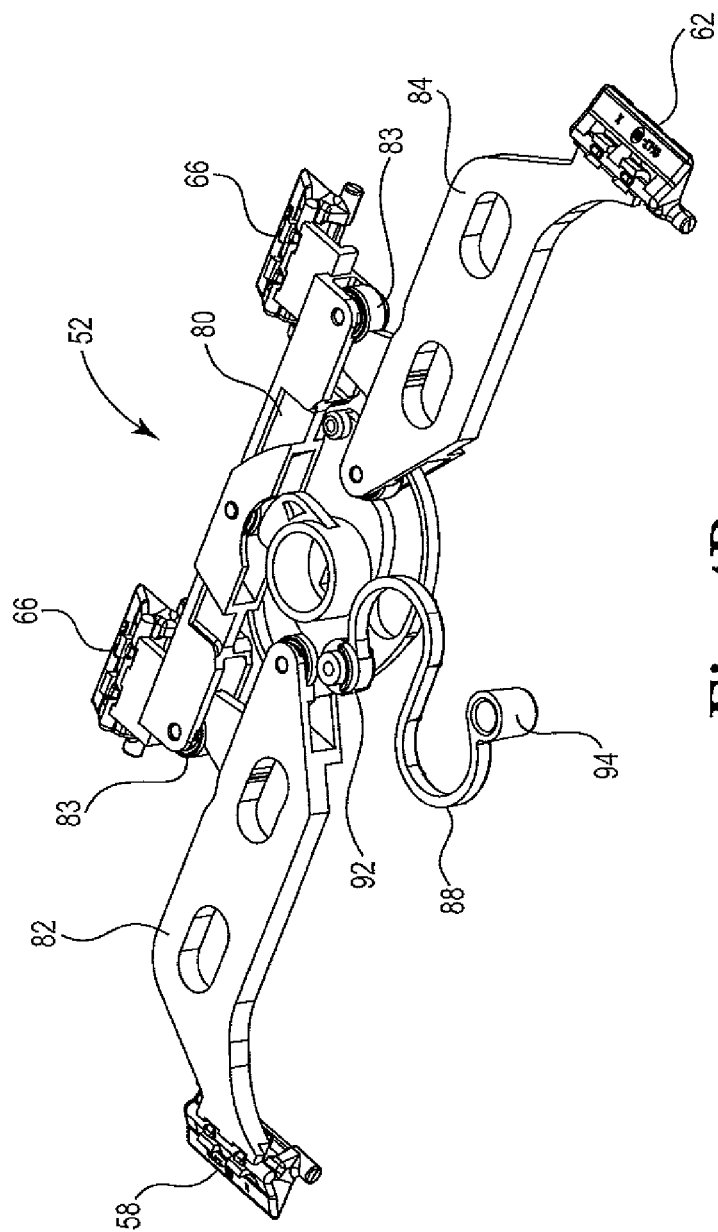
FIG. 4B is a bottom perspective view of a door latch mechanism in accordance with an embodiment of the disclosure.

FIGS. 3A and 3B show views of the door 24 with the latch covers 54 removed, exposing the latch mechanisms 52. FIGS. 4A and 4B show upper and lower views of the latch mechanisms 52 in isolation from the door assembly. FIGS. 3A and 4A show the latch mechanisms 52 in an unlatched position and FIGS. 3B and 4B show the latch mechanisms 52 in a latched position. Each latch mechanism 52 can be located an equal distance away from a center line 72 of the door 24. In some cases, as shown in FIGS. 3A and 3B, the right latch mechanism 52 is a mirror image of the left latch mechanism 52. As such, for simplicity, the left latch mechanism 52 will be used to show and describe the features of both the left and right latch mechanisms 52.

Referring collectively to FIGS. 3A-4B, each latch mechanism 52 includes a side or horizontal latch arm 80 for operating the latch members 66 located at each of the sides 68 of the door 24, and upper and lower latch arms 82, 84 for operating the latch members 58, 62 located at the top and bottom 60, 64 of the door 24, respectively. Each of the side latch arm 80 and upper and lower latch arms 82, 84 is operatively connected to a cam 76. Rotation of the cam 76 about its central axis causes the latch arms 80, 82, and 84 to move from a first position to a second position thus transitioning the latching mechanism 52 from a disengaged or unlatched position to an engaged or latched position. In the first position, the latch members 58, 62, and 66 are in a retracted position and are each disengaged from a corresponding slot provided in the door frame (not shown). Thus, the latching mechanism 52 is in a disengaged or unlatched position (FIG. 3A). In some cases, the disengaged position is a fully disengaged position, where each of the latch members 58, 62 and 66 are in a retracted position. In the second position, at least some of the latch members 58, 62 and 66 are engaged within a corresponding slot provided in the door frame (not shown) and thus, the latching mechanism 52 is in an engaged position (FIG. 3B). To be in a fully engaged position, all of the latch members 58, 62 and 66 are received within a corresponding slot provided in the door frame. In some cases, rotation of the cam 76 causes the latch members 58, 62 and 66 to transition from a fully disengaged position where the latch members 58, 62 and 66 are retracted, and not received within the corresponding slots provided in the door frame to a partially engaged position where at least some of the latch members 58, 62 and 66 are at least partially received within the corresponding slots provided in the door frame. Further rotation of the cam 76 causes the latching mechanisms 52 to further transition from the at least partially engaged position where at least the side latch members 66 are at least partially received within the corresponding slots provided in the doorframe to a fully engaged position wherein all of the latch members 58, 62 and 66 are engaged within the corresponding slots provided in the door frame.

Upon rotation of the cam 76, each latch mechanism 52 is configured such that the side latch arm 80 moves in a direction that is approximately orthogonal to the direction of movement of the upper and lower latch arms 82, 84. The term approximately orthogonal can be defined as 80 degrees to 110 degrees. In other cases, the latch arm 80 moves in a direction that is orthogonal or about 90 degrees to the direction of movement to the upper and lower latch arms 82, 84. For example, when the cam 76 is rotated, the side or horizontal latch arm 80 moves in a first direction away from the center line 72 of the door 24, and the upper and lower latch arms 82, 84 move in a second direction that is parallel to the center line 72 of the door 24. Horizontal latch arm 80 includes a first and second rollers 83 located at either end of the arm. In some cases, the rollers 83 cane be configured to follow and ride along a block structure 85 secured to or integrally formed with an inner surface of the door 24. Additionally, the cam 76 is configured such that it includes two independent rotational profiles, as will be described in greater detail herein.

As stated herein, a plurality of latch members can be distributed about the perimeter of the door to secure or latch the door 24 to the door frame 40. The door 24 can include four, six, eight or ten latch members distributed about the perimeter of the door 24. So that a number of latch members is distributed about a perimeter of the door 24, each of the side latch arm 80 and the upper and lower vertical latch arms 82, 84 includes at least one latch member. The side latch arm 80 can include at least one latch member 66 and as many as four latch members 66. In some cases, as shown, the side latch arm 80 includes two latch members 66. Each latch member 66 is connected to the side latch arm 80 such that when the door 24 is received within the door frame 40 and the latch mechanism 52 is operated from the disengaged position to an engaged position, as described herein, the latch members 66 are received within corresponding lots provided in the door frame 40. Additionally, in some cases, upper and lower vertical latch arms 82, 84 each include a latch member 58, 62 coupled their respective distal ends. In operation, when the door 24 is received within the door frame 40 and the latch mechanism 52 is operated from the disengaged to the engaged position, the latch members 58, 62 are received within corresponding openings or slots provided in the door frame 40. In some cases, each of the latch members 58, 62, and 66 can include a pivot pin, and are coupled to their respective latch arms 80, 82, and 84 such that they are configured to pivot or rotate about the pivot pin.

In operation, the cam 76 is rotated a sufficient amount in either the clockwise or counter-clockwise direction to cause the latch arms 80, 82, 84 as well as corresponding latch members 58, 62, and 66 to move from a first position to a second position. For example, the cam 76 can be rotated about 90 degrees in the counter-clockwise direction to cause the latch arms 80, 82, 84 to move from an disengaged position as shown in FIGS. 3A and 4A to a engaged position shown in FIGS. 3B and 4B. As stated previously, the cam 76 includes two independent cam profiles that are out of phase with one another such that in operation, the side latch members 66 engage the door frame 40 at a point in time prior to the upper and lower latch members 58, 62 engaging the door frame 40.

In many embodiments, a spring 88 is coupled to the cam 76 at a first pivot point 92 and also to the door 24 at a second pivot point 94. In some cases, the spring 88 may be an S-shaped spring, as shown. The first and second pivot points 92, 94 can be defined by bosses provided on the cam 76 and inner surface 91 of the door 24, respectively. Spring member 88 restrains the cam 76 rotationally and is neutrally biased, exerting no biasing force on the cam 76 when the cam is in either the latched or unlatched position. The spring 88 provides a rotational biasing force, urging the cam 76 toward either of a first favored position (disengaged or unlatched) or second favored position (engaged or latched), depending on the initial rotational position of cam 76. As an example, when cam 76 is rotated counter-clockwise from the neutral position depicted in FIG. 3A, the spring 88 is biased in compression and initially exerts a steadily increasing rotational biasing force on the cam 76 in a clockwise rotational direction. As cam 76 is rotated further counter-clockwise and reaches approximately the mid-point of its rotational travel range, the biasing force of spring 88 is directed through the center of cam 76. In this position, spring 88, although compressed, exerts no rotational biasing force on the cam 76. As the cam 76 is further rotated in the counter-clockwise direction past the mid-point of its rotational travel range, spring 88 exerts a biasing force, now urging cam 76 in the counter-clockwise direction. As cam 76 rotates further in the counter-clockwise direction, the rotational biasing force exerted by spring 88 steadily decreases as spring 88 decompresses.

In operation, cam 76 experiences about 90 degrees of rotational travel range. The spring 88 provides a rotational biasing force over nearly the entire rotational travel range of the cam. No biasing force is exerted on the cam 76 by the spring 88 when the cam 76 is at the mid-point of its rotational range, and when it is at either of the disengaged (unlatched) or engaged (latched) positions. Thus, the effective rotational range where spring member 86 provides a rotational biasing force urging cam member 68 toward its favored positions is nearly 45 degrees in each direction.

As mentioned previously, each cam 76 includes two independent rotational profiles. Each rotational profile is associated with each of the latch arms. For example, a first rotational profile is associated with the side latch arm 80 and a second rotational profile is associated with both of the upper and lower latch arms 82, 84. The two independent rotational profiles are configured such that they are out of phase with one another. In some cases, the first rotational profile is out of phase with the second rotational profile by about ten degrees to about thirty degrees. In other cases, the first rotational profile is out of phase with the second rotational profile by about fifteen degrees to about twenty-five degrees, and more particularly from by about seventeen degrees to about twenty-three degrees. In one embodiment, the first rotational profile is out of phase with the second rotational profile by about twenty degrees.

Utilizing a cam 76 having two independent rotational profiles affects the timing of the engagement of the latch members 58, 62 and 66. Rather than all of the latch arms 80, 82, 84 being operated from a disengaged or unlatched position to an engaged or latched position at the same point in time, having the side latch arm 80 follow a different rotational profile on the cam 76 than the upper and lower latch arms 82, 84, allows the sides latch members 66 to be operated at a different point in time than the top and bottom latch members 58, 62. Since a single arm is used to operate the side latch members 66 and is associated with the first rotational profile, the side latch members 66 can be considered to be a first set of latch members. Similarly, since both of the top and bottom latch members 58, 62 are associated with a second rotational profile, the top and bottom latch members 58, 62 can be defined as a second set of latch members. Providing two different rotational profiles facilitates application of the available load provided by the system in a staggered manner (e.g. the available load is first applied to the first set of door latch members and then applied to the second set of door latch members), and allows the cam 76 to apply approximately an amount of torque to operate the latch members 58, 62, and 66 to latch or unlatch the door 24 equal to the available load divided by the number of latch members associated with each of the rotational profiles, substantially increasing the amount of torque available for operating a single latch member or sets of latch members. Providing a cam 76 having two rotational profiles out of phase with another increases the amount of torque that may be applied to the door by each door latch mechanism 52, thus increasing the amount of clamping force for maintaining a robust seal between the door 24 and the door frame 40.

In other embodiments, a rotatable cam with a number of rotational profiles equal to the number of latch members or sets of latch members can be used to apply the available load to each individual latch member or sets of latch members. In one embodiment, a rotatable cam can include three independent rotational profiles, each profile associated with a latch member or a set of latch members dependent upon the configuration of the latch mechanism. For example, latch mechanism can include three latch arms, each latch arm being configured to follow one of three independent rotational profiles. Each latch arm may include a set of two latch members for a total of six latch members. The available torque associated with each rotational profile of the cam is equal to the available load divided by the number of latch members associated with each of the rotational profiles. For example, if two latch members were associated with a rotational profile, then the available load would be divided by two. In an embodiment having three latch members associated with a rotational profile, the available load would be divided by three. In another embodiment, a rotatable cam can include four independent rotational profiles, each profile associated with a latch arm for operating two latch members per each arm or one set of latch members for a total of eight latch members. In this case, the available torque is equal to the available load divided by the number latch members associated with a given rotational profile. As discussed herein, the independent cam profiles facilitate application of the available load provided by the system in a staggered manner (e.g. first available load is first applied to the first set of door latch members, followed by a second load applied by to the second set of door latch members, and finally a third available load is applied to a third set of latch members).

Figure 5B:
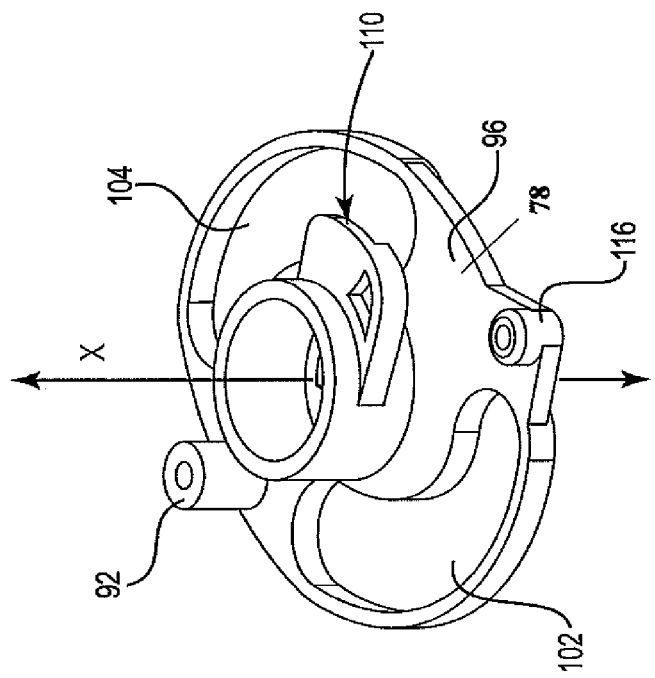
FIGS. 5A-5D show various views of a cam in accordance with embodiments of the disclosure.
Figure 5A:
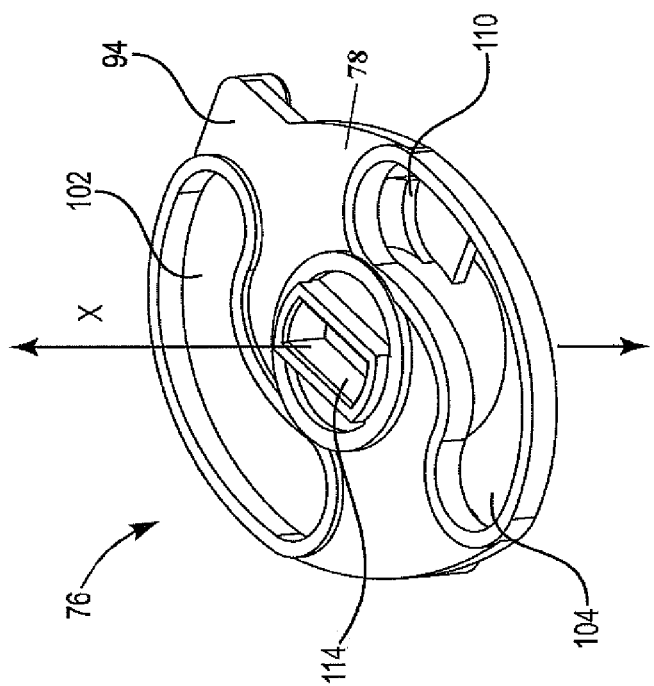
Figure 5D:
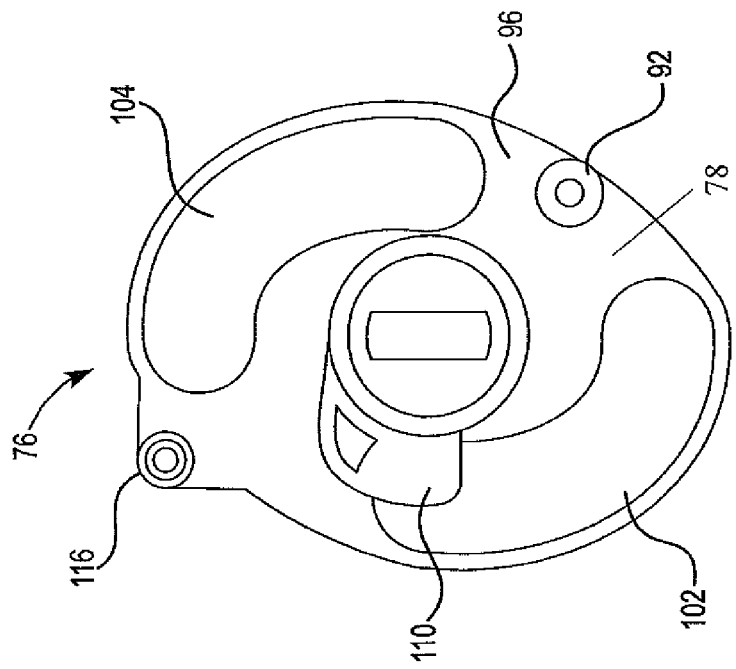
Figure 5C:
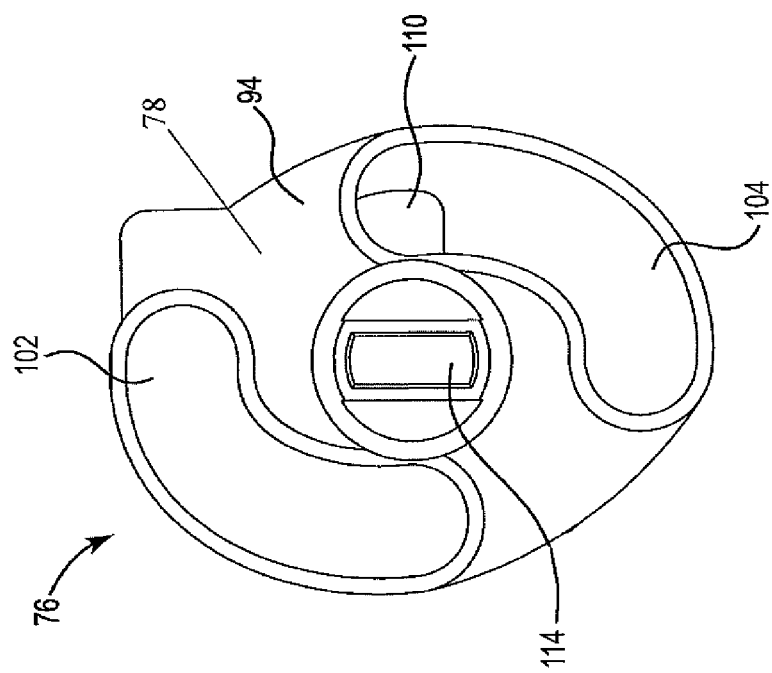

FIGS. 5A-5D show various views of a cam 76 including a first rotational profile and a second rotational profile. The cam 76 includes a plate-shaped cam portion 78 having an upper surface 94 and a lower surface 96. The first rotational profile is defined by first and second curved openings or slots 102, 104 that extend through the plate-shaped cam portion 78 from the upper surface 94 to the lower surface 96. The first and second slots 102, 104 defining the first rotational profile extend within a plane that is orthogonal to the central axis x of the cam 76 (FIGS. 5A and 5B). The second rotational profile is defined by a shoulder or lobe 110 extending away from the central axis x of the cam 76. The lobe 110 defining the second rotational profile also extends in a plane orthogonal to the central axis x and parallel to the plane in which the slots 102, 104 defining the first rotational profile extend. As shown, in FIGS. 5A-5D, the plate shaped cam portion 78 is disposed above the lobe 110. In some cases, the cam 76 can also include a key hole 114 for facilitating interaction between the door 24 of the carrier and the automation equipment. Also, as best seen in FIGS. 5B and 5D, the cam 76 includes a first boss 92 defining a pivot point for attachment of the spring 88 as shown in FIGS. 3A and 3B and a second boss 116 for aiding the return of the side latch arm from the an engaged position to the disengaged position.

Figure 6A:
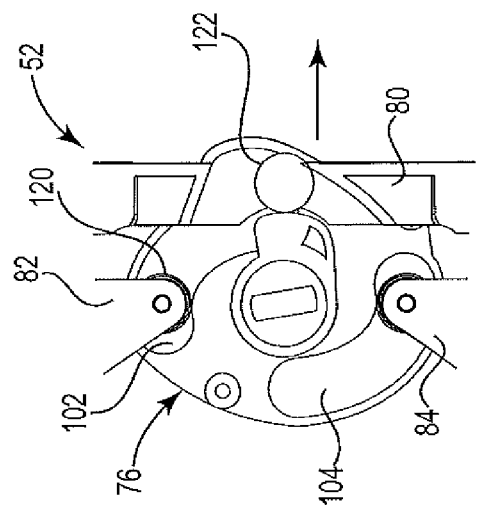
FIGS. 6A-6D are close-up schematic views of a portion of a door latch mechanism in accordance with an embodiment of the disclosure in various stages of operation between an unlatched and latched position.
Figure 6B:
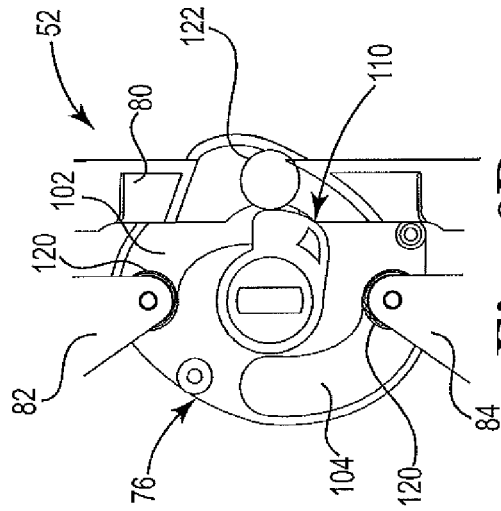
Figure 6C:
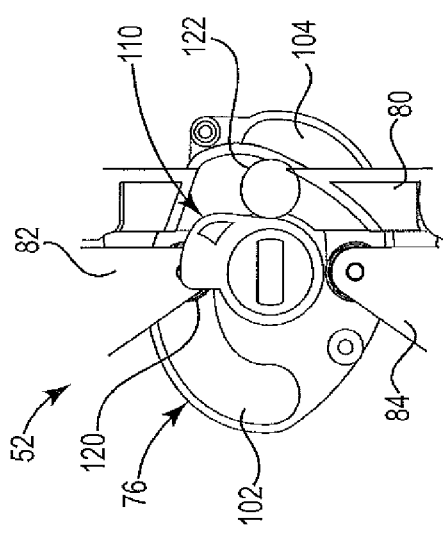
Figure 6D:
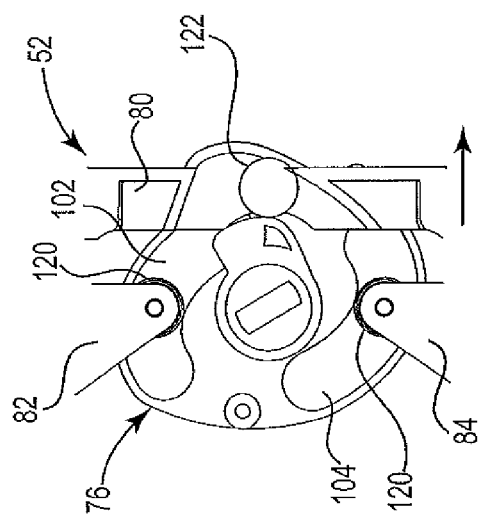

As an alternative to the second boss 116, which is provided on the plate-shape cam portion 78 to aid the return of the side latch arm 80, the cam 76 can include a second generally plate-shaped cam portion having at third curved opening or slot having an inner surface. A first portion of the inner surface of third curved opening or slot defines the lobe 110. A second, outer portion of the inner surface opposite the first portion defines an outer curvature of the third curved opening or slot. A roller coupled to the side arm is disposed in the third slot. As the side latch arm is operated form a first, disengaged position to a second, engaged position, the lobe 110 pushes on the roller causing the roller to travel within the slot, such that it follows the curvature of the lobe 110. As the side latch arm is operated from the second, engaged position to the first, disengaged position, the roller follows the outer curvature of the third curved opening defined by the second portion of the inner surface. FIGS. 6A-6D show close-up schematic views of an exemplary latch mechanism 52 at various stages of operation as seen from the bottom of the latch mechanism. FIG. 6A shows the latch mechanism 52 in a fully disengaged position and FIG. 6D show the latch mechanism 52 in a fully engaged position. As can be seen in FIGS. 6A-6D rollers 120 are provided at the distal ends of the upper and lower latch arms 82, 84. As the latch mechanism 52 is operated from an unlatched to an engaged position, the rollers 120 travel in the first and second curved slots 102, 104 defining the first rotational profile as the cam 76 is rotated in a first direction from a first, disengaged position (FIG. 6A) to a second, engaged position (FIG. 6D). As the cam 76 is rotated, the rollers 120 travel in the slots 102, 104 such that they cause the latch arms 82, 84 to gradually extend away from a center of the cam 76 as shown in FIGS. 6B and 6C. In addition, a lobe or shoulder 110 defining the second rotational profile contacts a roller 122 provided on an underside of the horizontal latch arm 80 (FIG. 6B and FIG. 6C) and begins to push the horizontal latch arm 80 outward in a direction away from a center of the door, as indicated by the arrow, and that is orthogonal to the direction in which the first and second latch arms 82, 84 extend. As shown in FIG. 6C, the lobe 110 defining the second rotational profile fully engages the horizontal latch arm 80, thus causing the horizontal latch arm 80 to be fully extended and the side latch members to be engaged with the door frame prior to the upper and lower latch arms 82, 84 reaching their fully extended positions. In addition, the cam 76 enters a dwell state prior to the rollers 120 of the upper and lower latch arms 82, 84 arriving at a second position within the first and second slots 102, 104, respectively, as shown in FIG. 6D, causing a timing delay to occur between when the side latch members are engaged with the door frame and the top and bottom latch members are engaged with the door frame The top and bottom latch members are engaged when the rollers 120 of the upper and lower latch arms 82, 84 are in the second position within the first and second slots 102, 104 defining the first rotational profile as shown in FIG. 6D.

Figure 7:
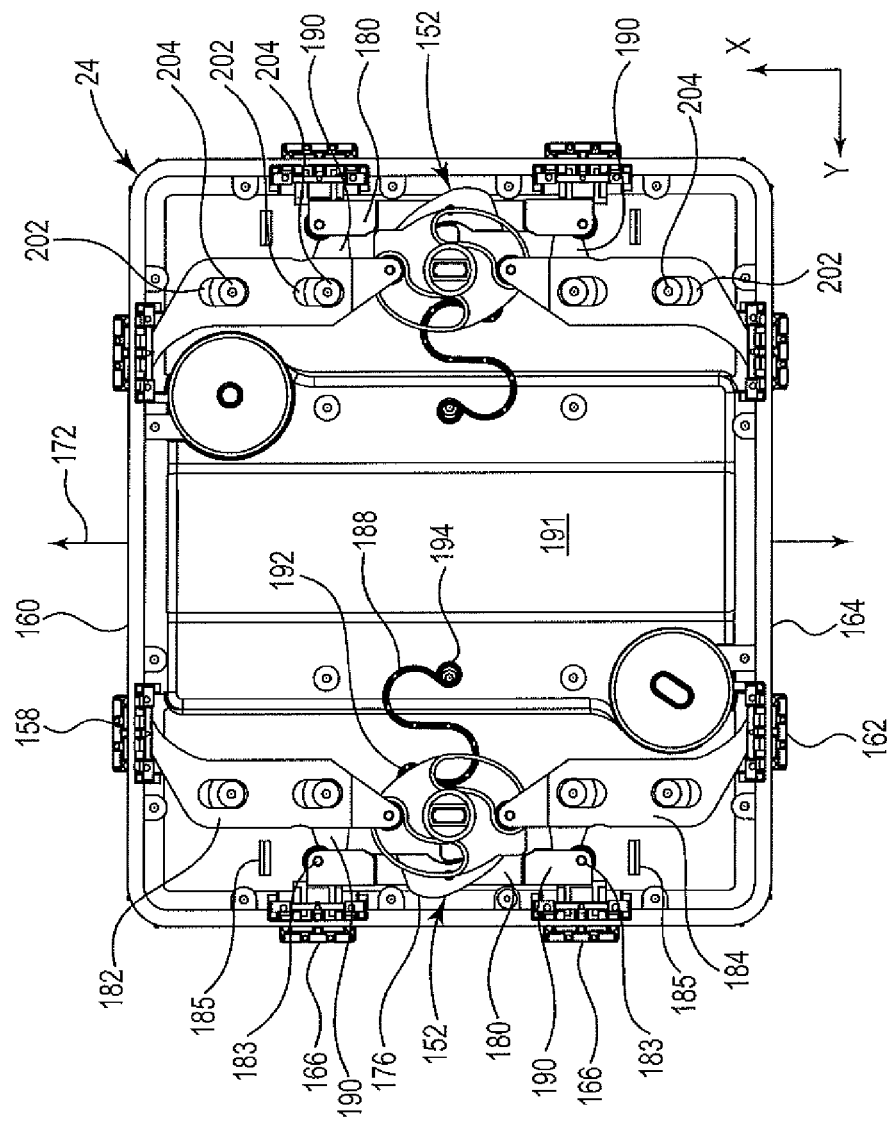
FIG. 7 is a top plan view of a door showing the latching mechanisms in accordance with another embodiment of the disclosure.
Figure 8A:
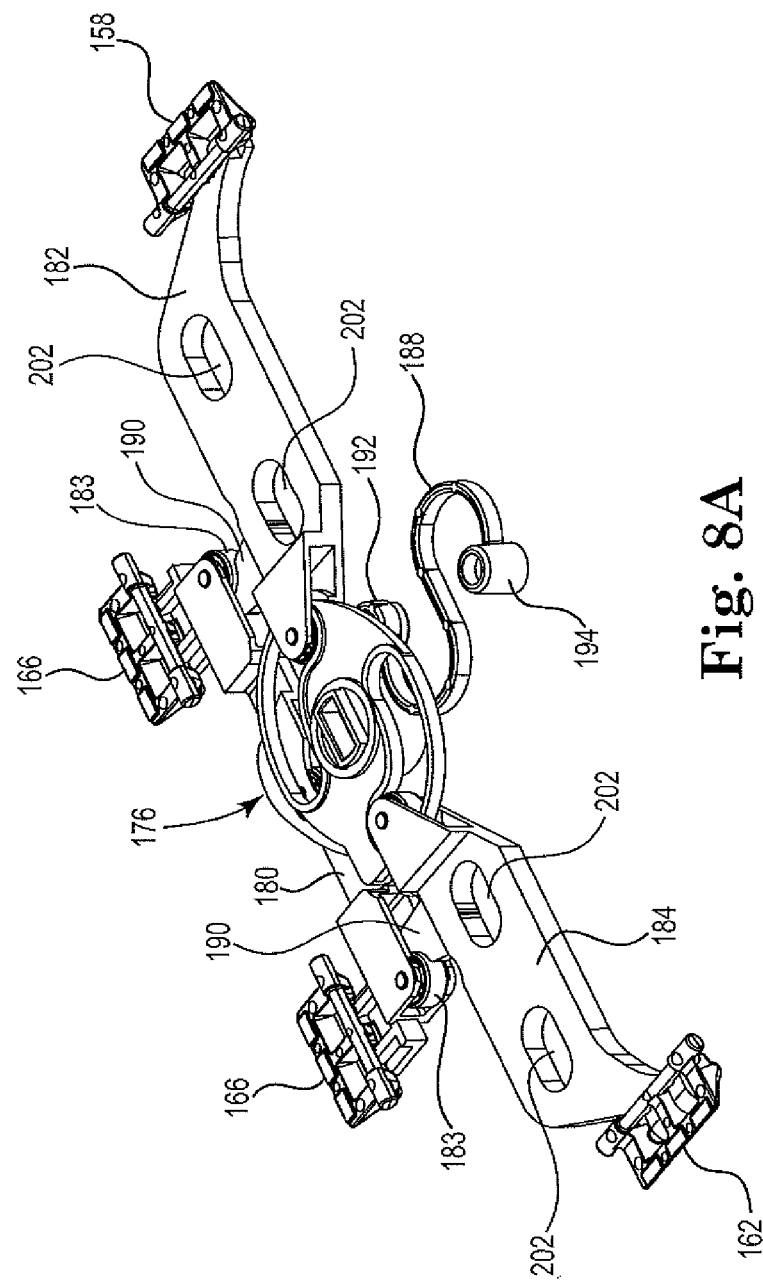
FIG. 8A is a top perspective view of a door latch mechanism in accordance with an embodiment of the disclosure.
Figure 8B:
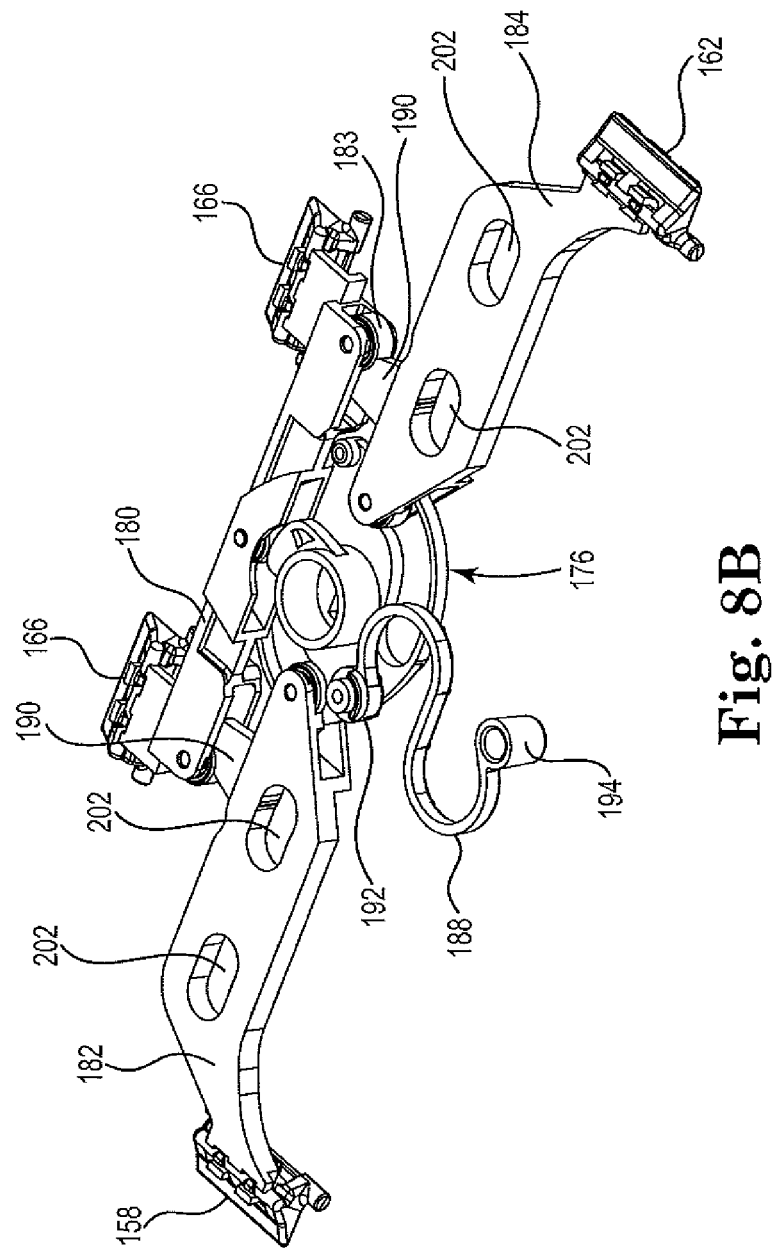
FIG. 8B is a bottom perspective view of a door latch mechanism in accordance with an embodiment of the disclosure.
Figure 9:
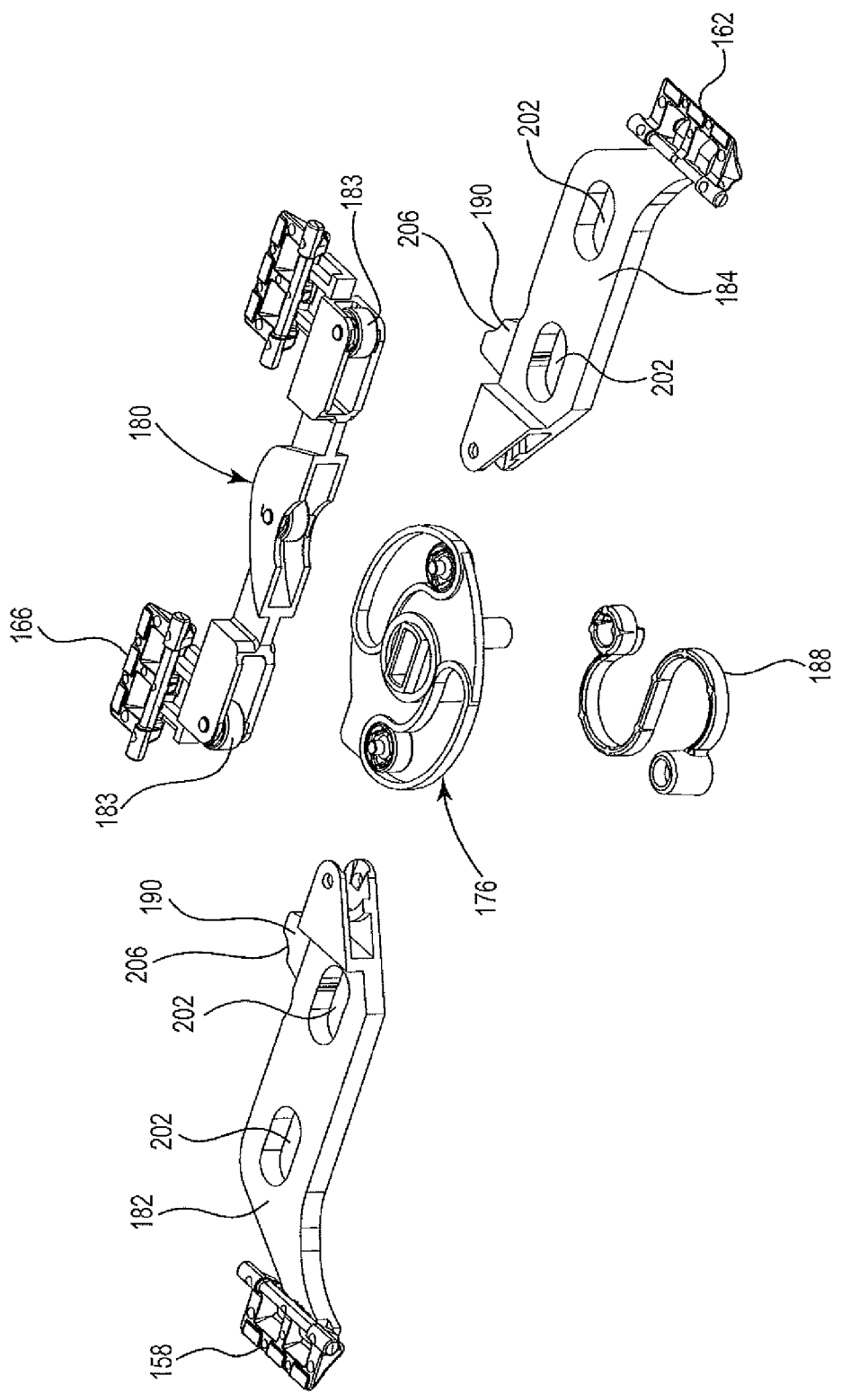
FIG. 9 is an exploded view of the latch mechanism show in FIG. 9.

Referring now to FIGS. 7-10C, another embodiment of a latch mechanism 152 for securing a door 24 within a door frame 40 of container body 22 thus providing a sealed enclosure is shown. FIG. 7 shows the latch mechanisms 152 in an engaged (latched) position. FIGS. 8A and 8B show upper and lower views of a latch mechanism 152 in isolation from the door assembly. FIG. 9 is an exploded view of the latch mechanism 152. As can be seen in FIG. 7, each latch mechanism 152 is located an equal distance away from a center line 72 of the door 24. In some cases, as shown in FIG. 7, the left latch mechanism 152 is a mirror image of the right latch mechanism 52. As such, for simplicity, the left latch mechanism 152 will be used to show and describe the features of both the left and right latch mechanisms 152.

Referring collectively to FIGS. 7-10C, each latch mechanism 52 includes a side or horizontal latch arm 180 for operating the latch members 166 at each of the sides 168 of the door 24, and upper and lower latch arms 182, 184 for operating the latch members 158, 162 at the top and bottom 160, 164 of the door 24, respectively. The side latch arm 180 can include at least one latch member 166 and as many as four latch members 166. In some cases, the side latch arm 180 includes two latch members 166. Each latch member 166 is connected to the side latch arm 180 such that when the door 24 is received within the door frame 40 and the latch mechanism 152 is operated from the disengaged position to the engaged position, the latch members 166 are received within corresponding openings or slots provided in the door frame 40. Additionally, in some cases, upper and lower vertical latch arms 182, 184 each include a latch member 158, 162 coupled their respective distal ends. In operation, when the door 24 is received within the door frame 40 and the latch mechanism 152 is operated from the unlatched to the latched position, the latch members 158, 162 are received within corresponding opening or slots provided in the door frame 40. In some cases, each of the latch members 158, 162, and 166 include a pivot pin and are coupled to their respective latch arms 180, 182, and 184 such that they are configured to pivot or rotate about the pivot pin.

As shown in FIGS. 7-10C, each of the side latch arm 180 and upper and lower latch arms 182, 184 is operatively connected to a cam 176. In some cases, the cam 176 is configured such that it includes two independent rotational profiles, as described in detail with reference to FIGS. 5A-5D. Rotation of the cam 176 about its central axis causes the latch arms 180, 182, and 184 to move from a first, disengaged (unlatched) position to a second, engaged (latched) position, as shown in FIG. 7. Upon rotation of the cam 176, each latch mechanism 152 is configured such that the horizontal latch arm 180 moves in a direction that is orthogonal to the direction of movement of the upper and lower latch arms 182, 184. For example, when the cam 176 is rotated, the side or horizontal latch arm 180 moves in a first direction away from the center line 172 of the door 24, and the upper and lower latch arms 182, 184 move in a second direction that is parallel to the center line 172 of the door 24.

As best seen in FIGS. 8A-9, horizontal latch arm 180 includes a first and second rollers 183 located at each end of the arm 180. However, unlike the embodiment shown with reference to FIGS. 3A-4B where the rollers 83 are located at each of the distal ends of the arm 80, in the illustrated embodiment of FIGS. 7-10C, the rollers 183 are positioned slightly inward from the respective distal ends of the arm 180. In addition, the rollers 183 are configured to follow and ride along a block structure 185 secured to or integrally formed with an inner surface 191 of the door 24. The block structure 185 prevents movement of the rollers 183 and more particularly, the horizontal arm 180 in the X direction.

As shown in FIGS. 7-9, each of the upper and lower latch arms 182, 184 can include a laterally extending side arm 190. Each of the side arms 190 extend in a direction away from their respective upper and lower latch arms 182, 184 towards the horizontal latch 180. In some cases, the side arms 190 extend in a direction that is orthogonal to the direction in which the upper and lower latch arms 182, 184 extend. The rollers 183 come into contact with the side arms 190 of the upper and lower latch arms 184 when the latch mechanism 152 is in a latched position as shown in FIG. 7. A distal end of each of the side arms 190 is configured to interact with the roller 183 provided on each end of the horizontal latch arm 180. In some cases, the side arms 190 each include a cutaway portion 206 that is sized and shaped to match the size and shape of each of the respective rollers 183. In one embodiment, the cutaway portion 206 has a curvature that follows the curvature of the rollers 183 such that when the latch mechanism 152 is in the latched position, each of the cutaway portions 206 located at each of the distal ends of the side arms 190 abuts against each of the rollers 183, respectively.

Because of the manner in which the rollers 183 interact with the side arms 190 of the upper and lower vertical latch arms 182, 184, movement of the horizontal latch arm 180 is constrained in the Y-direction when the latch mechanism 152 is in the latched position as shown in FIG. 7. This is because the upper and lower latch arms 182, 184 each include at least one slot 202 that is configured translate in the X direction along a boss 204 that is secured to or, in some cases, integrally formed with an inner surface 191 of the door. In some cases, the boss 204 can include a roller to facilitate movement of the upper and lower latch arms 182, 184. The horizontal latch arm 180 is tied to the door structure because of its interaction with the each of the side arms 190 of the upper and lower latch arms 182, 184 which translate along the bosses or rollers 204. This arrangement between the horizontal latch arm 180, the upper and lower vertical latch arms 182, 184, provides a stable support to the side latch members 166 when the latch mechanism because the horizontal latch arm and thus, the side latch member 166 are anchored to the boss 202 secured to the inner surface of the door 24. In addition, the arrangement between the horizontal latch arm 180, the upper and lower vertical latch arms 182, 184 provides a more rigid latch structure, maximizing the force of the side latch members 166, and may prevent flexing of the horizontal latch arm 180 that is caused by the amount of force applied to the horizontal latch arm 180 by the latch members 166.

In operation, the cam 176 is rotated a sufficient amount in either the clockwise or counter-clockwise direction to cause the latch arms 180, 182, 184 to move from a first position to a second position. For example, the cam 176 can be rotated about 90 degrees in the counter-clockwise direction to cause the latch arms 180, 182, 184 to move from a disengaged position to an engaged position, as shown. As stated previously, the cam 176 includes two independent rotational profiles that are out of phase with one another such that in operation, the side latch members 166 engage the door frame 40 at a point in time prior to the upper and lower latch members 158, 162 engaging the door frame 40.

In many embodiments, a spring 188 is coupled to the cam 176 at a first pivot point 192 and also to the door 24 at a second pivot point 194. The first and second pivot points 192, 194 can be defined by bosses provided on the cam 176 and inner surface 191 of the door 24, respectively. Spring member 188 restrains them cam 176 rotationally and is neutrally biased, exerting no biasing force on the cam 176 when the cam is in either the latched or unlatched position. The spring 188 provides a rotational biasing force, urging the cam 176 toward either of a first favored position (unlatched) or second favored position (latched), depending on the initial rotational position of cam 176 as described herein with reference to FIGS. 3A and 3B.

The cam 176 has a similar structure and function as the came described herein with reference to FIGS. 5A-5D. Each cam 176 includes two independent rotational profiles. The two independent rotational profiles are out of phase with one another. In some cases, the first rotational profile is out of phase with the second rotational profile by about ten degrees to about thirty degrees. In other cases, the first rotational profile is out of phase with the second rotational profile by about fifteen degrees to about twenty-five degrees, and more particularly from by about seventeen degrees to about twenty-three degrees. In one embodiment, the first rotational profile is out of phase with the second rotational profile by about twenty degrees.

Utilizing a cam 176 having two independent rotational profiles affects the timing of the engagement of the latch members 158, 162 and 166. Rather than all four latch arms being operated at once, having the side latch arm 180 follow a different rotational profile than the upper and lower latch arms 182, 184, allows the sides latch members 166 to be operated at a different point in time than the top and bottom latch members 158, 162. In addition, providing two different latch profiles facilitates application of a the available load provided by the system in a staggered manner (e.g. first available load is first applied to the first set of door latch members and then followed by a second load applied to the second set of door latch members), and allows the cam 176 to apply approximately an amount of torque allowed to operate each set of the latch members 158, 162, and 166 to latch or unlatch the door 24 equal to the available load divided by the number of latch members associated with an individual rotational profile, significantly increasing the amount of torque for each set of latch members. Providing a cam 176 having two cam rotational profiles out of phase with another increases the amount of torque that may be applied to the each door latch mechanism 152, thus increasing the amount of clamping force for maintaining a seal and/or securing the substrates within the container. In different embodiments, as described herein, a rotatable cam with a number of rotational profiles equal to the number of latch members could be used to apply the available load to each individual latch member to maximize the amount of torque applied to each latch member.

Figure 10C:
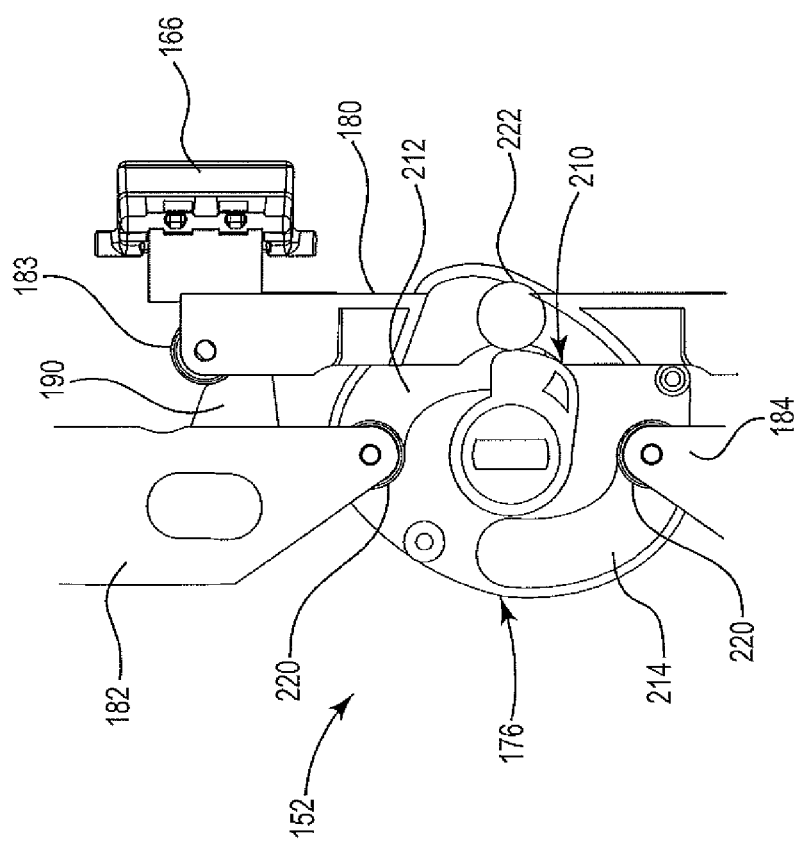

FIGS. 10A-10C show close-up schematic views of an exemplary latch mechanism 152 at various stages of operation as seen from the bottom of the latch mechanism. FIG. 10A shows the latch mechanism 152 in a disengaged position and FIG. 10C show the latch mechanism 152 in a fully engaged position. As can be seen in FIGS. 10A-10C rollers 220 are provided at the distal ends of the upper and lower latch arms 182, 184. As the latch mechanism 152 is operated from a disengaged to an engaged position, the rollers 220 travel in the first and second curved slots 212, 214 defining the first rotational profile as the cam 176 is rotated in a first direction from a first, disengaged (unlatched) position (FIG. 10A) to a second, engaged (latched) position (FIG. 10C). As the cam 176 is rotated, the rollers 220 travel in the slots 212, 214 such that they cause the latch arms 182, 184 to gradually extend away from a center of the cam 176 as shown in FIGS. 10B and 10C. Additionally, the roller 183 begins to slide along the curvature of the cutaway portion 206 of the side arm 190, and a lobe or shoulder 210 defining the second rotational profile contacts a roller 222 provided on an underside of the horizontal latch arm 180 (FIG. 10B). As the lobe contacts the roller 222, the lobe 210 begins to push the horizontal latch arm 180 outward in a direction away from a center of the door and that is orthogonal to the direction in which the first and second latch arms 182, 184 extend.

As shown in FIG. 10C, the lobe 210 defining the second rotational profile fully engages the horizontal latch arm 180, thus causing the horizontal latch arm 180 to be fully extended and the side latch members engaged with the door frame prior to the upper and lower latch arms 182, 184 reaching their fully extended positions. Additionally, the cutaway portion 206 of the side arm 190 abuts the roller 183 of the horizontal arm 180, thus supporting the horizontal latch arm 180 in the latched position. In some cases, the cam 176 can enter a dwell state prior to the rollers 220 of the upper and lower latch arms 182, 184 arriving at a second position within the first and second slots 212, 214, respectively, causing a timing delay to occur between when the side latch members are engaged and the top and bottom latch members are engaged with the door frame. The top and bottom latch members are engaged when the rollers 220 of the upper and lower latch arms 182, 184 are in the second position within the first and second slots 212, 214 defining the first rotational profile as shown in FIG. 10C.

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed

What is claimed is:

1. A substrate container comprising:
    a container body defining a door frame, the door frame having a plurality of openings;
    a door received in the door frame a perimeter; and
    a latching mechanism disposed within the door, the latching mechanism operable between a disengaged position and an engaged position, the latching mechanism comprising
        a first latch arm coupled directly to a rotatable cam according to a first rotational engagement, the first latch arm including a first latch member configured to be received in a first corresponding opening in the door frame when the latching mechanism is in the engaged position,
        a second latch arm coupled directly to the rotatable cam according to a second rotational engagement, the second latch arm including a second latch member configured to be received in a second corresponding opening in the door frame when the latching mechanism is in the engaged position,
    wherein the first rotational engagement and the second rotational engagement are out of phase such that when the cam is rotated to operate the latch mechanism from the disengaged position to the engaged position, the first latch member engages the first corresponding opening in the door frame at a point in time before the second latch member engages the second corresponding opening provided in the door frame.

2. The substrate container according to claim 1, wherein the first latch arm is configured to move in a direction that is approximately orthogonal to the direction of movement of the second latch arm.

3. The substrate container of claim 1, wherein the first rotational engagement is defined at least in part by first and second curved slots formed in the cam and the second rotational engagement is defined at least in part by a lobe extending in a direction away from a central axis of the cam.

4. The substrate container of claim 3, wherein the second latch arm is configured to extend in a plane that orthogonal to the central axis x of the cam and parallel to a plane in which the first and second curved slots defining the first rotational engagement extend.

5. The substrate container of claim 1, wherein the first latch arm includes a first roller disposed at the first end and a second roller disposed the second end, wherein the first roller and the second roller are each configured to ride along a block secured to an inner surface of the door.

6. The substrate container of claim 5, wherein the second latch arm includes a side arm configured to interact with one of the first or second rollers of the first latch arm when the latch mechanism is transitioned from the disengaged position to the engaged position.

7. The substrate container of claim 1, wherein the second latch arm includes at least one slot that is configured to translate along a stationary boss located to an inner surface of the door.

8. The substrate container of claim 7, wherein the boss comprises a roller.

9. The substrate container of claim 1, wherein the first rotational engagement is out of phase with the second rotational engagement by ten to thirty degrees.

10. The substrate container of claim 1, wherein the first rotational engagement is out of phase with the second rotational engagement by seventeen to twenty-three degrees.

11. The substrate container of claim 1, further comprising a second latching mechanism disposed within the door, the second latching mechanism operable between a disengaged position and an engaged position, the second latching mechanism comprising:
    a first latch arm coupled directly to the rotatable cam according to a first rotational engagement, the first latch arm including a first latch member configured to be received in a first corresponding opening in the door frame when the latching mechanism is in the engaged position,
    a second latch arm coupled directly to the rotatable cam according to a second rotational engagement, the second latch arm including a second latch member configured to be received in a second corresponding opening in the door frame when the latching mechanism is in the engaged position,
    wherein the first rotational engagement and the second rotational engagement are out of phase such that when the cam is rotated to operate the latch mechanism from the disengaged position to the engaged position, the first latch member engages the first corresponding opening in the door frame at a point in time before the second latch member engages the second corresponding opening provided in the door frame.

12. The substrate container of claim 1, wherein the substrate container is a front opening substrate container.

13. The substrate container of claim 1, wherein the substrate container is a bottom opening substrate container.

14. The substrate container of claim 1, wherein when the latching mechanism is in operation, an amount of torque associated with each of the first rotational engagement and the second rotational engagement is divided by a number of latch members associated with each of the first and second rotational engagements.

15. The substrate container of claim 1, wherein a set of latch members comprises one or more individual latch members.

16. A door for use with a substrate container, the door comprising:
    a latch mechanism including a rotatable cam;
    a first latch arm coupled directly to the rotatable cam according to a first rotational engagement, the first latch arm including a first latch member configured to move from an unlatched position to a latched position;
    a second latch arm coupled directly to the rotatable cam according to a second rotational engagement, the second latch arm including a second latch member configured to move from an unlatched position to a latched position;
    wherein the first rotational engagement and the second rotational engagement are out of phase such that when the cam is rotated to operate the latch mechanism from the disengaged position to the engaged position, the first latch arm moves in a direction that is approximately orthogonal to a direction of movement of the second latch arm, and the first latch member transitions to the engaged position at a point in time before the second latch member transitions to the engaged position.

17. The door of claim 16, further comprising a second latching mechanism disposed within the door, the second latching mechanism operable between a disengaged position and the engaged position, the second latching mechanism comprising:
    a rotatable cam,
    a first latch arm coupled directly to the rotatable cam according to a first rotational engagement, the first latch arm including a first latch member configured to move from an unlatched position to a latched position;
    a second latch arm coupled directly to the rotatable cam according to a second rotational engagement, the second latch arm including a second latch member configured to move from an unlatched position to a latched position;
    wherein the first rotational engagement and the second rotational engagement are out of phase such that when the cam is rotated to operate the latch mechanism from the disengaged position to the engaged position, the first latch arm moves in a direction that is approximately orthogonal to a direction of movement of the second latch arm, and the first latch member transitions to the engaged position at a point in time before the second latch member transitions to the engaged position.

18. The door of claim 17, wherein:
    each of the first latch arm includes a first roller disposed at a first end and a second roller disposed at a second end, wherein the first roller and the second roller are each configured to ride along a block secured to an inner surface of the door; and
    each of the second latch arms include a first side arm configured to interact with the first roller at the first end of the first latch arm, and at least one slot that is configured to translate along a boss secured to an inner surface of the door when the latch mechanism is transitioned form the disengaged position to the engaged position.

19. The door of claim 16, wherein the first rotational engagement is out of phase with the second rotational engagement by ten to thirty degrees.

20. The door of claim 16, wherein the first rotational engagement is out of phase the second rotational engagement by seventeen degrees to twenty-three degrees.

* * * * *